US 6,956,426 B2

(12) United States Patent
Wodnicki

(10) Patent No.: US 6,956,426 B2
(45) Date of Patent: Oct. 18, 2005

(54) INTEGRATED HIGH-VOLTAGE SWITCHING CIRCUIT FOR ULTRASOUND TRANSDUCER ARRAY

(75) Inventor: Robert Gideon Wodnicki, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 9 days.

(21) Appl. No.: 10/988,024

(22) Filed: Nov. 12, 2004

(65) Prior Publication Data

US 2005/0146371 A1    Jul. 7, 2005

Related U.S. Application Data

(62) Division of application No. 10/248,968, filed on Mar. 6, 2003, now Pat. No. 6,836,159.

(51) Int. Cl.$^7$ ............................................. H03K 17/16
(52) U.S. Cl. ........................ 327/382; 327/434; 323/315
(58) Field of Search ................................ 327/365, 382, 327/427, 434; 326/37, 38; 323/315, 316; 330/288

(56) References Cited

U.S. PATENT DOCUMENTS

| | | | |
|---|---|---|---|
| 4,005,382 A | * | 1/1977 | Beaver ........................ 367/105 |
| 4,079,352 A | * | 3/1978 | Burckhardt et al. ........... 367/93 |
| 4,080,838 A | * | 3/1978 | Kuroda et al. ................. 73/612 |
| 4,595,847 A | | 6/1986 | Weir |
| 5,212,474 A | | 5/1993 | Muhlemann |

(Continued)

FOREIGN PATENT DOCUMENTS

EP    1089433    4/2001

OTHER PUBLICATIONS

Proceedings of Powercon 7: Seventh National Solid-State Power Conversion Conference, San Diego, California, Mar. 24-27, 1980; National Solid-State Power Conversion (7$^{TH}$); 1980): San Diego, Calif.), 3500, J.2.1-J.2.11; Fragale, W. Using the Power MOSFETS Integral Reverse; Ventura, CA.: Power Concepts, 1980.

(Continued)

Primary Examiner—Kenneth B. Wells
(74) Attorney, Agent, or Firm—Jean K. Testa; Christian G. Cabou

(57) ABSTRACT

An integrated high-voltage switching circuit includes a switch having ON and OFF states and having a parasitic gate capacitance. The switch consists of a pair of DMOS transistors integrated back to back and having a shared gate terminal, the drains of the DMOS transistors being connected to the input and output terminals of the switch respectively. The switching circuit further includes a turn-on circuit comprising a PMOS transistor having its drain connected to the shared gate terminal of the switch via a first diode, having its source connected to a global switch gate bias voltage terminal from which the PMOS transistor draws current, and having its gate electrically coupled to a switch gate control terminal that receives a switch gate control voltage input. The switch transitions from the OFF state to the ON state in response to a first transition of the switch gate control voltage input that causes the PMOS transistor to turn on, and the switch remains in the ON state in response to a second transition of the switch gate control voltage input that causes the PMOS transistor to turn off. The DMOS transistors turn on in response to the shared gate being coupled to the switch gate bias voltage when the PMOS transistor turns on.

14 Claims, 4 Drawing Sheets

U.S. PATENT DOCUMENTS 6,288,603 B1  9/2001  Zanuccoli et al.
6,759,888 B1 * 7/2004  Wodnicki .................. 327/382

OTHER PUBLICATIONS

A Coplanar CMOS Power Switch; Ernst Habekotte, Bernd Hoefflinger, Wolfgang Renker, and Gunter Zimmer; IEEE Journal of Solid-State Circuits, vol. SC-16, No. 3, Jun. 1981.

A Versitile Micropower High-Voltage Flat Panel Display Driver in a 100-V 0.7-um CMOS Intelligent Interface Technology; Jan Doutreloigne, Herbert De Smet. and Andre Van Calster; IEEE Journal of Solid-State Circuits, vol. 36, No. 12, Dec. 2001.

A Monolithic 200-V CMOS Analog Switch; James D. Plummer, and James D. Meindl; IEEE Journal of Solid-State Circuits, vol. SC-11, No. 6, Dec. 1976.

A High Voltage MOS Switch; Krishna C. Saraswat, James D. Meindl, and Josef Berger; IEEE Journal of Solid-State Circuits, vol. SC-10, No. 3, Jun. 1975.

* cited by examiner

INTEGRATED HIGH-VOLTAGE SWITCHING CIRCUIT FOR ULTRASOUND TRANSDUCER ARRAY

This application is a divisional of U.S. patent application Ser. No. 10/248,968 filed on Mar. 6, 2003, now issued as U.S. Pat. No. 6,836,159.

STATEMENT REGARDING FEDERALLY SPONSORED RESEARCH AND DEVELOPMENT

The United States Government may have certain rights in this invention pursuant to U.S. Government Contract Number DAMD17-02-1-0181 awarded by the U.S. Army.

BACKGROUND OF THE INVENTION

This invention generally relates to integrated high-voltage switching circuitry. In particular, the invention relates to integrated high-voltage switching circuitry for use in conjunction with an array of elements. Such arrays include, but are not limited to, ultrasound transducer arrays, liquid crystal display pixel arrays, and so forth.

For the purpose of illustration, various embodiments of the invention will be described with reference to an ultrasound transducer array, e.g., the so-called "mosaic annular array", for use in ultrasound imaging. A mosaic annular array employs the idea of dividing the active aperture of an ultrasound transducer into a mosaic of very small subelements and then forming annular elements from these subelements by interconnecting them with electronic switches. However, the geometry of the array elements is not limited to annular shapes. These array "elements" can be "moved" electronically along the surface of the mosaic array to perform scanning by changing the switch configuration. Other element configurations permit beamsteering, which will provide the ability to acquire volumetric data sets. A configuration of multiple concentric annular elements provides optimal acoustic image quality by matching the element shapes to the acoustic phase fronts. The switches of the present invention are not limited to use in mosaic arrays.

Conventional ultrasound imaging systems comprise an array of ultrasonic transducers that are used to transmit an ultrasound beam and then receive the reflected beam from the object being studied. Such scanning comprises a series of measurements in which the focused ultrasonic wave is transmitted, the system switches to receive mode after a short time interval, and the reflected ultrasonic wave is received, beamformed and processed for display. Typically, transmission and reception are focused in the same direction during each measurement to acquire data from a series of points along an acoustic beam or scan line. The receiver is dynamically focused at a succession of ranges along the scan line as the reflected ultrasonic waves are received.

For ultrasound imaging, the array typically has a multiplicity of transducers arranged in one or more rows and driven with separate voltages. By selecting the time delay (or phase) and amplitude of the applied voltages, the individual transducers in a given row can be controlled to produce ultrasonic waves that combine to form a net ultrasonic wave that travels along a preferred vector direction and is focused in a selected zone along the beam.

The same principles apply when the transducer probe is employed to receive the reflected sound in a receive mode. The voltages produced at the receiving transducers are summed so that the net signal is indicative of the ultrasound reflected from a single focal zone in the object. As with the transmission mode, this focused reception of the ultrasonic energy is achieved by imparting separate time delay (and/or phase shifts) and gains to the signal from each receiving transducer. The time delays are adjusted with increasing depth of the returned signal to provide dynamic focusing on receive.

The quality or resolution of the image formed is partly a function of the number of transducers that respectively constitute the transmit and receive apertures of the transducer array. Accordingly, to achieve high image quality, a large number of transducers is desirable for both two- and three-dimensional imaging applications. The ultrasound transducers are typically located in a hand-held transducer probe that is connected by a flexible cable to an electronics unit that processes the transducer signals and generates ultrasound images. The transducer probe may carry both ultrasound transmit circuitry and ultrasound receive circuitry.

It is known to include high-voltage components in the transmit circuitry to drive the individual ultrasound transducers, while low-voltage, high-density digital logic circuitry is used to provide transmit signals to the high-voltage drivers. The high-voltage drivers typically operate at voltages of up to approximately 100 volts, while the low-voltage logic circuitry has an operating voltage on the order of 5 volts in the case of TTL logic. The high-voltage drivers may be fabricated as discrete components or as integrated circuits, while the low-voltage logic circuitry may be fabricated as a separate integrated circuit or combined with the high-voltage circuitry on a single chip. In addition to transmit circuitry including the high-voltage drivers and low-voltage logic circuitry, the transducer head may include low-noise, low-voltage analog receive circuitry. The low-voltage receive circuitry, like the transmit logic circuitry, typically has an operating voltage on the order of 5 volts, and may be a separate integrated circuit or may be fabricated with the low-voltage transmit logic circuitry as a monolithic integrated circuit.

In order to maximize the number of transducers to achieve high-quality ultrasound images, it is desirable to integrate as much circuitry as possible in as small a volume as possible to reduce the size and complexity of the circuitry, whether the circuitry be located within a transducer probe or in an electronics unit separate therefrom. In addition, some applications, for example, very high-frequency ultrasound imaging, require that transmit circuitry be located as close as possible to the transducers to avoid signal loading by a long cable.

In addition, the integrated circuit must include switches for coupling selected ultrasound transducers of the array with the associated high-voltage drivers during transmit and with associated receivers during receive. One proposed ultrasound transducer array that employs integrated high-voltage driving circuits is a so-called "mosaic annular array". In a mosaic annular array ultrasound probe there is a need for both matrix and access switches that can withstand the high voltages used on transmit. At the same time, since the array contains upwards of 40,000 switches, low-power operation is an important consideration. In addition, it must be possible to cascade many such switches in series, and to selectively program their switch ON resistance to correct for process variation. Finally, the switch should have the ability to retain its state independent of additional logic, thereby simplifying the required digital circuitry and also enabling the use of different transmit and receive apertures.

Currently, ultrasound machines use commercially available high-voltage switch integrated circuits that are generally packaged in groups of eight switches per device. A representative patent for this technology is U.S. Pat. No. 4,595,847. Generally, this device uses high-voltage DMOS switches that are integrated back to back. This is well known in the prior art as a requirement due to the parasitic body diodes that are contained in the devices. [See, for example, "Using the Power MOSFET's Integral Reverse Rectifier," Fragale et al., Proc. PowerCon 7: Seventh National Solid-State Power Conversion Conference, San Diego, Calif. March 1980.] An important feature of this device is the ability to tolerate high voltages on both of the signal terminals while floating the gate control terminal relative to this voltage. A level shifter is employed to allow the switch to operate in this manner.

An application similar to that of the present invention is driving a liquid crystal display (LCD). The LCD requires high voltages (100 V) but does not require high current. A solution to the LCD driver problem is disclosed by Doutreloigne et al. in a paper entitled "A Versatile Micropower High-Voltage Flat-Panel Display Driver etc." and also in European Published Patent Application No. 1089433. This device also uses high-voltage DMOS switches; however, it uses a dynamically biased level shifter. The advantage of using a dynamically biased level shifter is that it does not dissipate static power. The technique of dynamic storage of control voltage is well known in the prior art and is most often found in dynamic shift registers and in dynamic RAM, which are prevalent in commercial electronics. In particular, U.S. Pat. No. 5,212,474 discloses a high-voltage level shifter that uses dynamic storage of voltage to effect a low-power and small-form factor device.

In U.S. Pat. No. 6,288,603, Zanuccoli et al. disclose a high-voltage bidirectional switch that operates in a similar fashion to that disclosed by Doutreloigne et al., with the improved ability to operate independent of supply voltages at the switch terminals. This device also uses a dynamic level shifter that stores a control voltage on the gate of the switch FET. The device is adapted for operation with a single NMOS device and goes to great length to make this possible.

There is a need in an ultrasound transducer array for both matrix and access switches that can withstand the high voltages used on transmit while consuming low power. It must be possible to cascade many such switches in series. They must have individually programmable switch ON resistance. Finally, these switches should have the ability to retain their state independent of additional logic and with controlled variation of ON resistance.

BRIEF DESCRIPTION OF THE INVENTION

The present invention is directed to high-voltage switching circuits, devices incorporating high-voltage switching circuits and methods of programming high-voltage switching circuits. Although the disclosed embodiments are suitable for use in an ultrasound transducer array, the high-voltage switching circuits disclosed herein are not limited to ultrasound imaging applications.

One aspect of the invention is an integrated high-voltage switching circuit comprising: a switch having ON and OFF states and having a parasitic gate capacitance, the switch comprising a pair of DMOS transistors integrated back to back and having a shared gate terminal, the drains of the DMOS transistors being connected to the input and output terminals of the switch respectively; and a turn-on circuit comprising a PMOS transistor having its drain connected to the shared gate terminal of the switch via a first diode, having its source connected to a first global switch gate bias voltage terminal from which the PMOS transistor draws current, and having its gate electrically coupled to a switch gate control terminal that receives a switch gate control voltage input. The switch transitions from the OFF state to the ON state in response to a first transition of the switch gate control voltage input that causes the PMOS transistor to turn on, and the switch remains in the ON state in response to a second transition of the switch gate control voltage input that causes the PMOS transistor to turn off.

Another aspect of the invention is an ultrasound transducer probe comprising: a plurality of ultrasound transducers; an ultrasound transducer driving circuit; and a plurality of high-voltage switching circuits respectively connected to the plurality of ultrasound transducers, wherein each of the switching circuits comprises a respective switch having input and output terminals, and a respective switch control circuit for controlling the state of the respective switch, the switches being connected in series with the output terminal of each switch (except the last switch) being connected to the input terminal of the next switch, each ultrasound transducer being coupled to a respective output terminal of a respective switch, each switch control circuit comprising a respective turn-on circuit that receives switch gate control voltage inputs, and the driving circuit being coupled to the input terminal of a first one of the switches. Each switch transitions from an OFF state to an ON state in response to a first transition of the respective turn-on circuit's switch gate control voltage input that causes the turn-on circuit to turn on, and each switch remains in the ON state in response to a second transition of the respective turn-on circuit's switch gate control voltage input that causes the turn-on circuit to turn off.

A further aspect of the invention is a device comprising an integrated high-voltage switching circuit and a switch programming circuit wherein: the integrated high-voltage switching circuit comprises a plurality of switches connected in series and a plurality of switch control circuits, each of the switch control circuits controlling the state of a respective one of the plurality of switches and comprising a respective turn-on circuit that receives switch gate control voltage inputs at a respective switch gate control voltage input terminal and receives a global switch gate bias voltage at a respective global switch gate bias voltage terminal, wherein each switch transitions from an OFF state to an ON state in response to a first transition of the respective turn-on circuit's switch gate control voltage input that causes the turn-on circuit to turn on, and each switch remains in the ON state in response to a second transition of the respective turn-on circuit's switch gate control voltage input that causes the turn-on circuit to turn off, wherein the global switch gate bias voltage terminals are connected to a common bus; and the programming circuit programs each switch with its own switch gate turn-on voltage as a function of the respective global switch gate bias voltages applied via the bus.

Yet another aspect of the invention is a method for programming a plurality of high-voltage switching circuits, comprising the following steps: (a) providing a first switch gate bias voltage level on a first bus connected to each of the high-voltage switching circuits; (b) selecting a first one of the plurality of high-voltage switching circuits via a second bus; (c) providing a first switch gate control voltage level to the first switching circuit that turns on a first transistor that applies the first switch gate bias voltage level to a shared gate of a first pair of switch FETs integrated back to back, the shared gate having a parasitic gate capacitance; (d) providing a second switch gate control voltage level to the first switching circuit that turns the first transistor off while the parasitic gate capacitance of the first pair of switch FETs retains the first switch gate bias voltage level, the first switch gate bias voltage level being sufficient to turn the first pair of switch FETs on; (e) providing a second switch gate bias voltage level on the first bus, the first and second switch gate bias voltage levels being different; (f) selecting a second one of the plurality of high-voltage switching circuits via the second bus; (g) providing a first switch gate control voltage level to the second switching circuit that turns on a second transistor that applies the second switch gate bias voltage level to a shared gate of a second pair of switch FETs integrated back to back, the shared gate having a parasitic gate capacitance; and (h) providing a second switch gate control voltage level to the second switching circuit that turns the second transistor off while the parasitic gate capacitance of the second pair of switch FETs retains the second switch gate bias voltage level, the second switch gate bias voltage level being sufficient to turn the second pair of switch FETs on.

Other aspects of the invention are disclosed and claimed below.

DETAILED DESCRIPTION OF THE INVENTION

Figure 1:
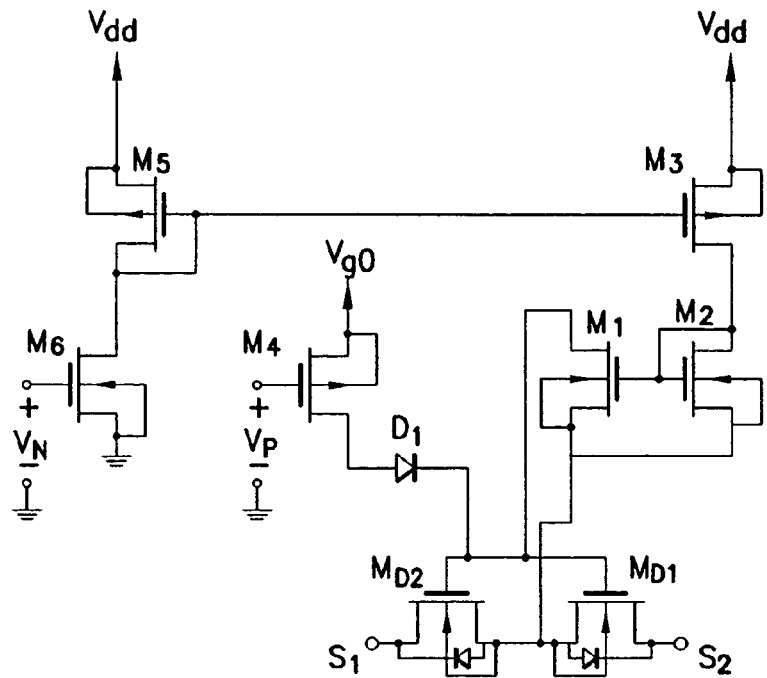
FIG. 1 is a diagram showing a high-voltage switching circuit in accordance with one embodiment of the invention.

At the outset it should be noted that the connections to ground shown in the drawings are simplifications. In each of the embodiments disclosed herein, the ground terminal is likely to be connected to a negative voltage which is often called $V_{SS}$. While it is simplest to show this as ground and in some cases ground is in fact used, It is understood that ground is simply a reference voltage and that other voltages both positive and negative (with respect to ground) could also be used depending on the application.

The invention is directed to switching circuits that solve the aforementioned problems. A large number of switches can be directly integrated in a high-voltage CMOS process to withstand ultrasound transmit pulse voltages. The gate voltage can be uniquely programmed for each switch. The invention provides for low power operation and allows switches to be cascaded without any substantial leakage current when the switch is on. Also, the invention provides switches that have their own local memory, i.e., the switches have the ability to memorize switch state. Various embodiments of the invention will now be described with reference to the drawings for the purpose of illustration.

FIG. 1 shows one embodiment of the invention. Transistors $M_{D1}$ and $M_{D2}$ are DMOS FETs that are connected back to back (source nodes shorted together) to allow for bipolar operation. This connection is necessary due to the parasitic body diodes (as shown in the schematic) that would otherwise provide a conduction path from drain to source of either device during the positive or negative phase of the ultrasound transmit pulse.

In the embodiment shown in FIG. 1, current flows through the switch terminals $S_1$ and $S_2$ whenever both $M_{D1}$ and $M_{D2}$ are turned on. To turn on the switch, the gate voltage of these devices must be greater than their source voltage by a threshold voltage. Above the threshold voltage, switch ON resistance varies inversely with the gate voltage. Since the source voltage will be close to the drain voltage (for low ON resistance and low current), the source voltage will track the ultrasound transmit pulse voltage. In order for the gate-source voltage to remain constant, the gate voltage must also track the transmit pulse voltage. This can be achieved by isolating the source and gate from the switch control circuitry and providing a fixed potential at the gate with reference to the source. As described above, this is achieved in the prior art for ultrasound using static level shifters. In the embodiment shown in FIG. 1, a dynamic level shifter is used. This level shifter operates as follows:

Transistor $M_4$ is a high-voltage PMOS transistor capable of withstanding the process maximum (e.g., 100 V) between its drain and source terminals. The source of transistor $M_4$ is biased at the global switch gate bias voltage $V_{g0}$ (nominally 5 V) as shown. In order to turn on the switch, the gate voltage $V_P$ of transistor $M_4$ is transitioned from high (5 V) to low (0 V), causing the global bias voltage $V_{g0}$ to be applied through transistor $M_4$ to the shared gate terminal of the FETs $M_{D1}$ and $M_{D2}$. The diode $D_1$ is provided to prevent transistor $M_4$ from turning on when the DMOS switch gate voltage drifts above $V_{g0}$. Once the switch gate voltage has reached $V_{g0}$, the parasitic gate capacitance of the FETs $M_{D1}$ and $M_{D2}$ will retain this voltage. For this reason, once the gate voltage has stabilized, transistor $M_4$ can be turned off to conserve power. Leakage current at the drain of transistor $M_4$ will eventually dissipate the bias voltage at the switch gate, but this voltage can be reprogrammed periodically if necessary. The fact that the switch ON state is effectively stored on the switch gate capacitance means that the switch has its own memory, which is useful since extra state flip-flops do not need to be provided for that purpose.

When in the ON state, the switch can be turned off using gate clamp NMOS transistor $M_1$. This is done by applying a turn-on voltage to the gate of transistor $M_1$ using the level shifter composed of transistors $M_2$, $M_3$, $M_5$ and $M_6$. When this transistor is turned on, it forces the switch gate voltage to be equal to the switch source voltage, which moves the switch $M_{D1}$ and $M_{D2}$ to its OFF state. The action of making these voltages equal effectively dissipates the charge left on the gate capacitance after the turn-on operation described above. Once the charge is removed, transistor $M_1$ does not have to be left on. This means that the control level shifter circuit for this device can be turned off once the switch has stabilized, and this will save power. Again, the OFF state can be stored for an extended period and reprogrammed if necessary.

The circuit shown in FIG. 1 has the following advantages: (1) low power since there is no static current dissipation to keep the device in the ON or OFF state; power is only dissipated during transition from one state to the next state; (2) state memory since the switch state is effectively stored on the switch gate capacitance; (3) cascadable switches due to the absence of a static bias current and voltage drop in the ON state; and (4) programmable ON resistance since $V_{g0}$ can be individually controlled.

Figure 4:
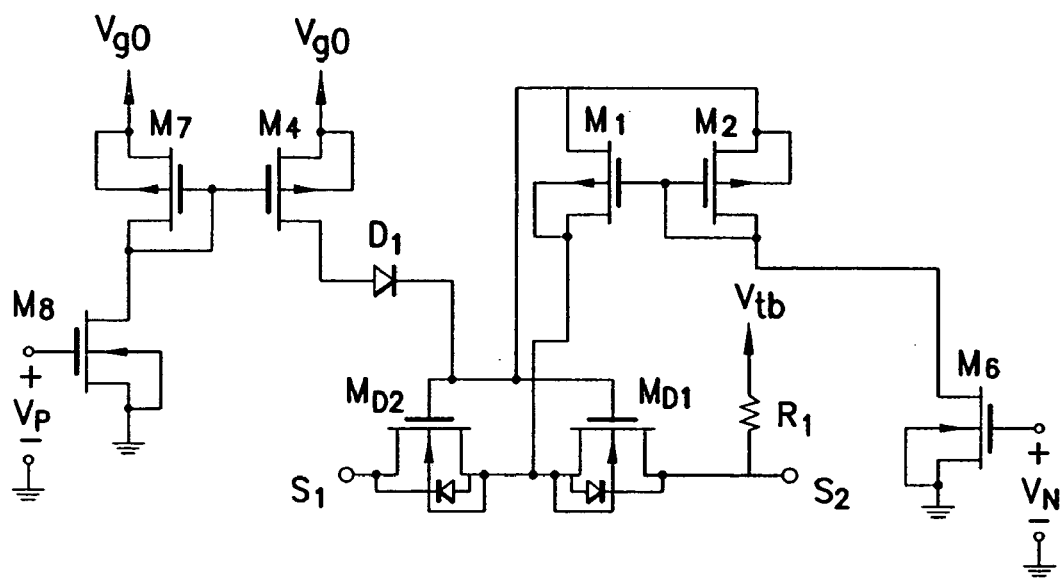
FIG. 4 is a diagram showing a high-voltage switching circuit with floating PMOS clamp circuit in accordance with a further embodiment of the invention.
Figure 5:
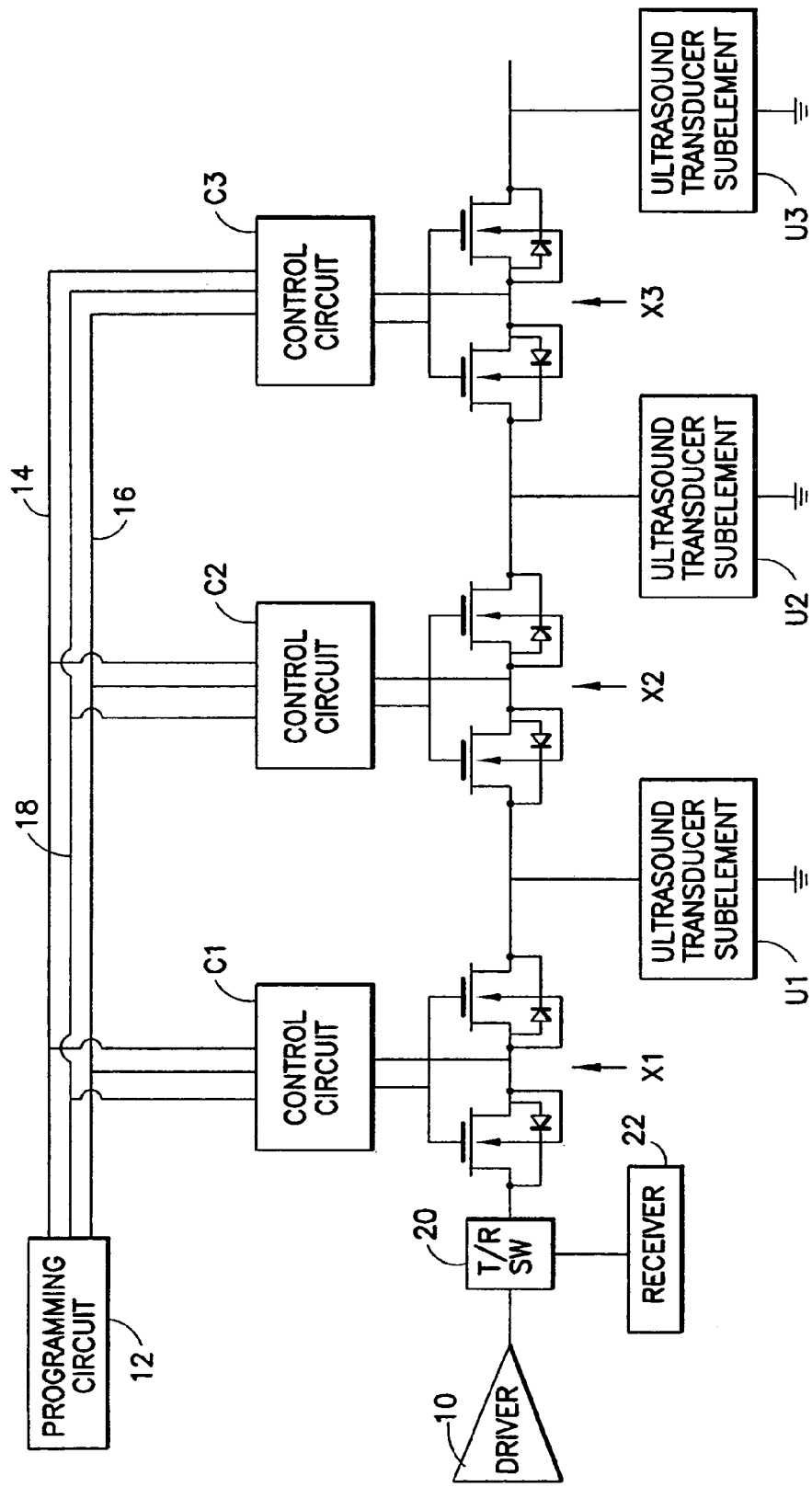
FIG. 5 is a diagram showing a cascade of high-voltage switching circuits for selectively driving ultrasound transducers of an array.

The circuit shown in FIG. 1 (as well as each of the circuits shown in FIGS. 2–4) can be used as part of a cascade of switches, as shown in FIG. 5. The exemplary cascade shown in FIG. 5 comprises three switches X1, X2 and X3 connected in series, although it should be understood that more than three switches can be cascaded in the manner shown. The states of the switches X1 through X3 are controlled by respective switch control circuits C1 through C3. For example, each of switch control circuits C1 through C3 may comprise transistors M1 through M6 connected as depicted in FIG. 1. Other exemplary structures for the control circuits C1 through C3 in FIG. 5 will be described later with reference to FIGS. 2–4 respectively.

There is a digital circuit (not shown) that controls $V_N$ and $V_P$ in FIG. 1. In one embodiment, this digital circuit has local memory of the state of the switch. An external control system (programming circuit 12 in FIG. 5) programs all of the switch memories to be in either the ON, OFF or NO_CHANGE state using a DATA line 18. Then a global select line 14 (see FIG. 5) is used to apply the state to the actual switch control circuit. So until the select line is actuated, $V_N$ and $V_P$ are both zero. In this state the switch itself retains its last state. When the global select line 14 is actuated, the stored switch state is transferred to the switch itself by either bringing $V_N$ high (turn off the switch), $V_P$ low (turn on the switch), or $V_N$ low and $V_P$ high (no change to the switch state). The global switch gate bias voltage terminals of each switch X1–X3 in FIG. 5 are connected to a bus 16. The global select line 14, in conjunction with the global switch gate bias voltage bus 16, allow the turn-on voltage of each switch X1–X3 to be programmed independently. More specifically, each switch can be programmed with its own unique gate turn-on voltage that can be used to adjust the switch ON resistances of all switches in the array to correct for variation due to processing. In an array, this action can be accomplished by first deselecting all switch control circuits (i.e., forcing $V_N$ low and $V_P$ high in all circuits using the global select line 14) and then applying the gate voltage for a first switch on the global gate voltage bus 16. The (first) switch that will receive this voltage is then "programmed" to the ON state (i.e., the switch is activated such that its resistance drops from the megaohm range to hundreds of ohms and current begins to flow between the source and drain of the device). Once the voltage has stabilized, the programming circuit 12 is turned off. Then the gate voltage for a second switch is applied on the global gate voltage bus 16. The (second) switch that will receive this voltage is then programmed on. This sequence can be repeated until every switch in the array receives its proper turn-on voltage. Also, groups of switches that have similar turn-on voltages can be biased simultaneously by not changing the global gate voltage before turning each switch in that group on. Lastly, in an array separate gate voltage buses 16 could be used for each row of switches to increase the speed of programming.

Still referring to FIG. 5, a first ultrasound transducer subelement U1 can be driven by the ultrasound driver 10 when a transmit/receive (T/R) switch 20 is in its transmit switch state and switch X1 is turned on; a second ultrasound transducer subelement U2 can be driven by the ultrasound driver 10 when T/R switch 20 is in its transmit switch state and switches X1 and X2 are both turned on; and a third ultrasound transducer subelement U3 can be driven by the ultrasound driver 10 when T/R switch 20 is in its transmit switch state and switches X1, X2 and X3 are all turned on. In this case, in order to provide a DC path during programming, a turn-on sequence must be followed. For example, given three switches: X1, X2, and X3 cascaded from left to right with switch X1 connected to the ultrasound driver, first X1 must be turned on. This will connect the terminal shared by X1 and X2 to the ultrasound driver through X1. Next, X2 can be turned on, which will also connect the terminal shared by X2 and X3 to the driver. Finally, X3 can be turned on also. In the receive mode, the return signals detected by the respective ultrasound transducer elements are received by a receiver 22 via the respective switches and the T/R switch 20 switched to its receive switch state.

Figure 2:
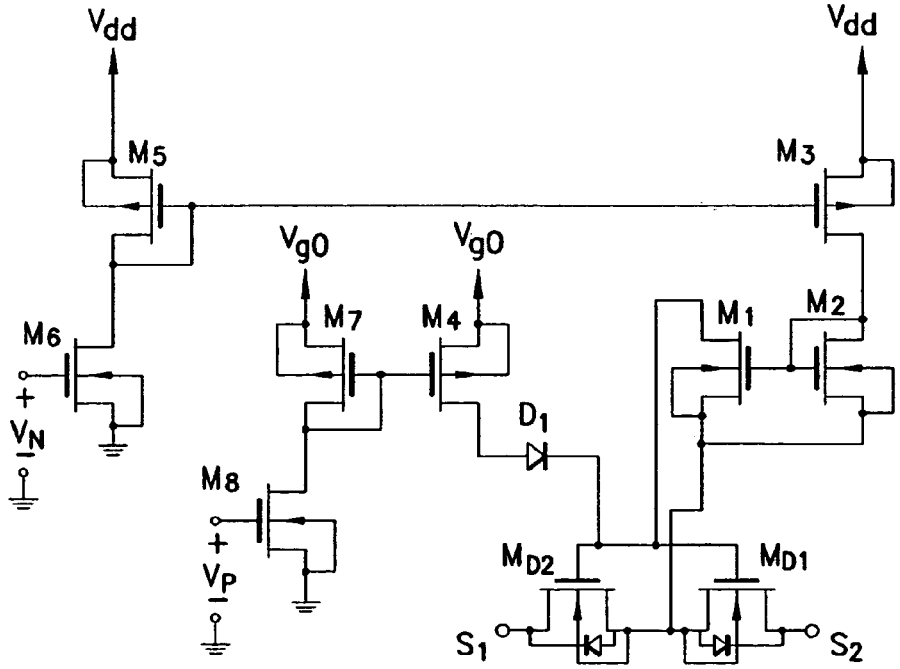
FIG. 2 is a diagram showing a high-voltage switching circuit with extended gate control voltage capability in accordance with another embodiment of the invention.

The circuit of FIG. 1 can be improved upon as shown in FIG. 2. Here transistors $M_7$ and $M_8$ have been added to provide a level shifter for the $V_P$ input control voltage. This circuitry makes it possible to use a control voltage that is independent of the switch gate voltage $V_{g0}$. For example, $V_P$ could advantageously swing between 0–3.3 V or 0–1.5 V for low-power operation, while the switch gate control voltage $V_{g0}$ would be set between 5 and 10 V depending on the types of DMOS FETs used.

Figure 3:
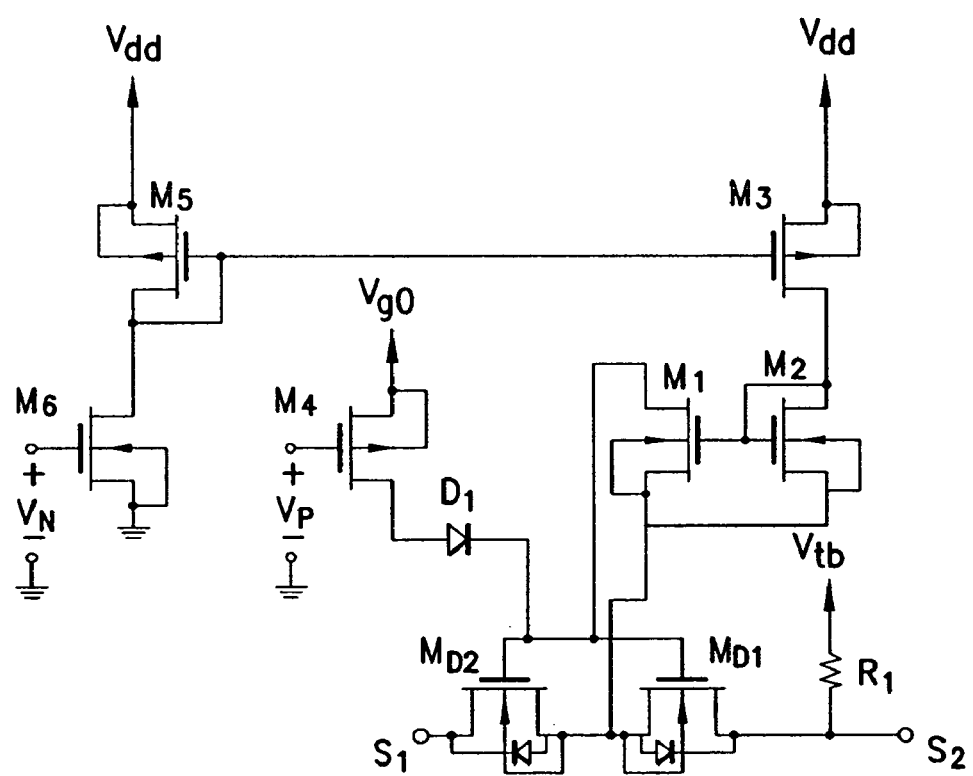
FIG. 3 is a diagram showing a high-voltage switching circuit with integrated bias resistor in accordance with a further embodiment of the invention.

Another improvement to the circuit of FIG. 1 is shown in FIG. 3. The addition of the bias resistor $R_1$ allows one terminal (i.e., $S_2$) of the switch to be kept at a constant potential $V_{tb}$. This voltage is used to bias the ultrasound transducer that would ordinarily be connected at this terminal, and also acts as a "bleed resistor" to quickly return the transducer to its steady state. The addition of $R_1$ also makes it possible to cascade switches without the need for a turn-on sequence as described above. Without the additional path to ground, it may not be possible to reliably turn on a switch that is isolated between two other switches that are turned off since the floating terminals are not at a known potential. Since the source voltage is effectively not controlled, omitting the bias resistor will cause an unpredictable voltage to be left on the DMOS gate-source terminals. This voltage may be too low to turn on the switch, may turn it on with the wrong ON resistance, or may be large enough to damage the device.

An improvement to the circuit of FIG. 2 is shown in FIG. 4. This circuit operates in manner similar to the circuit in FIG. 2, with the difference being that the floating NMOS pair of transistors ($M_1$ and $M_2$) that clamp the DMOS transistor gate voltage have been replaced with floating PMOS transistors. This difference is significant because in some CMOS processes, floating NMOS transistors are not available, and the transistors must float in order for the circuit to work correctly. This change also simplifies the circuit somewhat by reducing the number of level shifter transistors required (i.e., transistors $M_3$ and $M_5$ in the circuit of FIG. 2 have been eliminated).

Before the switches can be programmed to correct for processing variations, calibration must be performed. Depending on the level of accuracy needed, calibration could be done on one or two representative switches (e.g., at either end of an array of switches) and, in the latter case, an average used. Calibration could also be done a single time (e.g., during production) and then used during operation. Calibration could also be done repeatedly during operation to correct for shifts in parameters due to temperature variation.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

What is claimed is:

1. An integrated high-voltage switching circuit comprising:
    a switch having ON and OFF states and having a parasitic gate capacitance, said switch comprising a pair of DMOS transistors integrated back to back and having a shared gate terminal, the drains of said DMOS transistors being connected to the input and output terminals of said switch respectively; and
    a turn-on circuit comprising a PMOS transistor having its drain connected to said shared gate terminal of said switch via a first diode, having its source connected to a first global switch gate bias voltage terminal from which said PMOS transistor draws current, and having its gate electrically coupled to a first switch gate control terminal that receives a first switch gate control voltage input,
    wherein said switch transitions from the OFF state to the ON state in response to a first transition of said first switch gate control voltage input that causes said PMOS transistor to turn on, and said switch remains in said ON state in response to a second transition of said first switch gate control voltage input that causes said PMOS transistor to turn off.

2. The switching circuit as recited in claim 1, further comprising a turn-off circuit comprising:
    a level shifter connected to a voltage supply terminal from which said level shifter draws current, said voltage supply terminal and said first global switch gate bias voltage terminal being supplied with different voltages, said level shifter comprising a first level shifter transistor having its gate connected to a second switch gate control terminal that receives a second switch gate control voltage input; and
    a first gate clamp transistor having its drain connected to said shared gate terminal of said switch, its source connected to a junction of the sources of said DMOS transistors and to said level shifter, and its gate connected to said level shifter,
    wherein said switch transitions from the ON state to the OFF state in response to a first transition of said second gate control voltage input that causes said first level shifter transistor to turn on, and said switch remains in said OFF state in response to a second transition of said second gate control voltage input that causes said first level shifter transistor to turn off.

3. The switching circuit as recited in claim 1, further comprising a driving circuit electrically coupled to said switch input terminal and an ultrasound transducer electrically coupled to said switch output terminal.

4. The switching circuit as recited in claim 2, further comprising a driving circuit electrically coupled to said switch input terminal and an ultrasound transducer electrically coupled to said switch output terminal.

5. The switching circuit as recited in claim 2, wherein said level shifter further comprises a second level shifter transistor having its gate connected to the gate of said first gate clamp transistor and shorted to its own drain, its source connected to the source of said first gate clamp transistor, and its drain electrically coupled to said second switch gate control terminal via said first level shifter transistor.

6. The switching circuit as recited in claim 1, wherein said turn-on circuit further comprises a level shifter connected to the gate of said PMOS transistor, said level shifter comprising a first level shifter transistor having its gate connected to said first switch gate control terminal.

7. The switching circuit as recited in claim 6, wherein said level shifter further comprises a second level shifter transistor having its gate connected to the gate of said PMOS transistor and shorted to its own drain, its source connected to a second global switch gate bias voltage terminal, and its drain connected to the drain of said first level shifter transistor, wherein said first and second global switch gate bias voltage terminals receive the same bias voltage.

8. The switching circuit as recited in claim 7, wherein said first level shifter transistor is an NMOS transistor and said second level shifter transistor is a PMOS transistor.

9. The switching circuit as recited in claim 1, further comprising a bias resistor connected between said switch output terminal and a constant voltage supply.

10. The switching circuit as recited in claim 2, further comprising a bias resistor connected between said switch output terminal and a constant voltage supply.

11. The switching circuit as recited in claim 1, further comprising:
    a turn-off circuit comprising a gate clamp transistor and a level shifter, said gate clamp transistor having its drain connected to said shared gate terminal of said switch and having its source connected to a junction of the sources of said DMOS transistors; and
    a bias resistor connected between said switch output terminal and a constant voltage supply.

12. A method for programming a plurality of high-voltage switching circuits, comprising the following steps:
    providing a first switch gate bias voltage level on a first bus connected to each of said high-voltage switching circuits;
    selecting a first one of said plurality of high-voltage switching circuits via a second bus;
    providing a first switch gate control voltage level to said first switching circuit that turns on a first transistor that applies said first switch gate bias voltage level to a shared gate of a first pair of switch FETs integrated back to back, said shared gate having a parasitic gate capacitance;
    providing a second switch gate control voltage level to said first switching circuit that turns said first transistor off while the parasitic gate capacitance of said first pair of switch FETs retains the first switch gate bias voltage level, said first switch gate bias voltage level being sufficient to turn said first pair of switch FETs on with a first ON resistance;
    providing a second switch gate bias voltage level on said first bus, said first and second switch gate bias voltage levels being different;
    selecting a second one of said plurality of high-voltage switching circuits via said second bus;
    providing a first switch gate control voltage level to said second switching circuit that turns on a second transistor that applies said second switch gate bias voltage level to a shared gate of a second pair of switch FETs integrated back to back, said shared gate having a parasitic gate capacitance; and
    providing a second switch gate control voltage level to said second switching circuit that turns said second transistor off while the parasitic gate capacitance of said second pair of switch FETs retains the second switch gate bias voltage level, said second switch gate bias voltage level being sufficient to turn said second pair of switch FETs on with a second ON resistance.

13. The method as recited in claim 12, further comprising the following steps:
providing a third switch gate bias voltage level on said first bus;
selecting a third one of said plurality of high-voltage switching circuits via said second bus;
providing a first switch gate control voltage level to said third switching circuit that turns on a third transistor that applies said third switch gate bias voltage level to a shared gate of a third pair of switch FETs integrated back to back, said shared gate having a parasitic gate capacitance; and
providing a second switch gate control voltage level to said third switching circuit that turns said third transistor off while the parasitic gate capacitance of said third pair of switch FETs retains the third switch gate bias voltage level, said third switch gate bias voltage level being sufficient to turn said third pair of switch FETs on with a third ON resistance.

14. The method as recited in claim 13, wherein said first through third pairs of switch FETs are cascaded, said first pair of switch FETs are turned on before said second pair of switch FETs are turned on, and said second pair of switch FETs are turned on before said third pair of switch FETs are turned on.

* * * * *